US008026146B2

(12) United States Patent  (10) Patent No.: US 8,026,146 B2
Donkers et al.  (45) Date of Patent: Sep. 27, 2011

(54) METHOD OF MANUFACTURING A BIPOLAR TRANSISTOR

(75) Inventors: Johannes J. T. M. Donkers, Valkenswaard (NL); Sebastien Nuttinck, Heverlee (BE); Guillaume L. R. Boccardi, Leuven (BE); Francois Neuilly, Colomby-sur-Thaon (FR)

(73) Assignee: NXP B.V., Eindhoven (NL)

( * ) Notice: Subject to any disclaimer, the term of this patent is extended or adjusted under 35 U.S.C. 154(b) by 281 days.

(21) Appl. No.: 12/439,363

(22) PCT Filed: Aug. 29, 2007

(86) PCT No.: PCT/IB2007/053476
§ 371 (c)(1),
(2), (4) Date: Feb. 27, 2009

(87) PCT Pub. No.: WO2008/026175
PCT Pub. Date: Mar. 6, 2008

(65) Prior Publication Data
US 2010/0022056 A1   Jan. 28, 2010

(30) Foreign Application Priority Data
Aug. 31, 2006  (EP) .................................. 06300911

(51) Int. Cl.
*H01L 21/8222* (2006.01)
(52) U.S. Cl. ........ 438/312; 438/170; 438/189; 438/235; 438/309; 438/340; 257/471; 257/273; 257/370; 257/557; 257/571; 257/E21.35; 257/E21.371; 257/E21.608
(58) Field of Classification Search .................. 438/170, 438/172, 189, 191, 203, 205, 234, 235, 236, 438/309, 312, 313, 322, 327, 336, 340, FOR. 165, 438/FOR. 179, FOR. 186, FOR. 166; 257/47, 257/197, 273, 370, 378, 477, 557, 565, 571, 257/E21.35, E21.608, E21.371
See application file for complete search history.

(56) References Cited

U.S. PATENT DOCUMENTS
5,484,737 A * 1/1996 Ryum et al. .................. 438/318
(Continued)

FOREIGN PATENT DOCUMENTS
EP   1583153 A1   10/2005
WO   2005122268 A2   12/2005

OTHER PUBLICATIONS

Melai, J., et al; "A New Sub-Micron 24V SiGe: C Resurf HBT"; Power Semiconductor Devices and ICS, 2004, Proceeding; ISPSD '04; IEEE, Piscataway, NJ, USA; PAY 24, 2004; pp. 33-36; XP010723322; ISBN: 4-88686-060-5.
(Continued)

*Primary Examiner* — Matthew Smith
*Assistant Examiner* — Su Kim

(57) ABSTRACT

The invention provides for an alternative and less complex method of manufacturing a bipolar transistor comprising a field plate (17) in a trench (7) adjacent to a collector region (21), which field plate (17) employs a reduced surface field (Resurf) effect. The Resurf effect reshapes the electric field distribution in the collector region (21) such that for the same collector-base breakdown voltage the doping concentration of the collector region (21) can effectively be increased resulting in a reduced collector resistance and hence an increased bipolar transistor speed. The method comprises a step of forming a base window (6) in a first base layer (4) thereby exposing a top surface of the collector region (21) and a part of an isolation region (3). The trench (7) is formed by removing the exposed part of the isolation region (3), after which isolation layers (9,10) are formed on the surface of the trench (7). A second base layer (13) is formed on the isolation layer (10), thereby forming the field plate (17), on the top surface of the collector region (21), thereby forming a base region (31), and on a sidewall of the first base layer (4), thereby forming an electrical connection between the first base layer (4), the base region (31) and the field plate (17). An emitter region (41) is formed on a top part of the base region (31), thereby forming the Resurf bipolar transistor.

10 Claims, 6 Drawing Sheets

U.S. PATENT DOCUMENTS

| | | | |
|---|---|---|---|
| 6,455,364 B1* | 9/2002 | Asai et al. | 438/235 |
| 7,132,344 B1* | 11/2006 | Knorr | 438/313 |
| 7,442,595 B2* | 10/2008 | Freeman et al. | 438/189 |
| 2002/0048892 A1* | 4/2002 | Kitahata | 438/364 |
| 2002/0076874 A1* | 6/2002 | Coolbaugh et al. | 438/202 |
| 2002/0168829 A1* | 11/2002 | Bock et al. | 438/309 |
| 2006/0011943 A1* | 1/2006 | Howard | 257/197 |

OTHER PUBLICATIONS

Hueting, R.J.E., et al; "A New Trench Bipolar Transistor for RF Applications"; IEEE Transactions on Electron Devices; IEEE, Pisacataway, NJ, US; vol. 51, No. 7, Jul. 2004; pp. 1108-1113; XP001196891; ISSN: 0018-9383.

Nuttinck, S. L. A. F., et al; "RF CMOS Options: Resurf LCHBT"; TCAD Analysis; Technical Note PR-TN 2006/00593; Jul. 2006; Philips Research Europe.

Magnee, P. H. C., et al; "SiGe: C HBT Technology for Advanced BICMOS Process"; Philips Research; 12th GAAS Symposium—Amsterdam, NL; 2004; pp. 243-246.

Cao, G.J., et al; "Trade-Off Between the Kirk Effect and the Breakdown Performance in Resurfed Lateral Bipolar Transistors for High Voltage, High Frequency Applications"; Solid-State Electronics 44 (2000); p. 1869-1873.

* cited by examiner

METHOD OF MANUFACTURING A BIPOLAR TRANSISTOR

FIELD OF THE INVENTION

The invention relates to a method of manufacturing a bipolar transistor.

BACKGROUND OF THE INVENTION

Bipolar transistors are important for high-frequency applications, such as optical data communication, and for RF power applications, such as power amplifier modules in wireless handset applications. Generally, it is important in RF power applications to have a bipolar transistor with both a good high-frequency performance and a high base-collector junction breakdown voltage ($BV_{CB0}$) to meet ruggedness demands, especially during load mismatch conditions. This speed-breakdown trade-off is, amongst others, influenced by the drift region in the collector region of the bipolar transistor. A higher doping concentration of the collector drift region increases the speed of the bipolar transistor, but reduces the breakdown voltage between the collector region and any other adjacent region, such as the base region.

One way of improving the speed-breakdown trade-off is by applying the reduced surface field (Resurf) effect. In "A new Sub-Micron 24V SiGe:C Resurf HBT", by J. Melai et al, ISPSD, 2004, it is disclosed that the Resurf effect comprises the reshaping of the electric field distribution in the collector drift region for a reverse bias situation such that a more uniform electric field distribution with a reduced maximum electric field is formed. The BVCB0 of the bipolar transistor is thereby increased or, alternatively, for the same BVCB0 the doping concentration of the collector region can effectively be increased resulting in a reduced collector resistance and hence an increased bipolar transistor speed. A method to implement the Resurf effect in a bipolar transistor is the addition of a field plate, which is electrically isolated from the collector drift region by a dielectric layer. By applying a suitable voltage on the field plate, the electric field of the collector drift region is reshaped into the more uniform electric field distribution. The method of manufacturing a bipolar transistor with a field plate, which is disclosed in "A new Sub-Micron 24V SiGe:C Resurf HBT", by J. Melai et al, ISPSD, 2004, starts with the formation of a sub-collector region in a semiconductor substrate followed by the epitaxial growth of a collector drift region on the sub-collector region. Then standard shallow trench isolation (STI) regions are formed and a base layer is epitaxially grown on the collector drift region. On the base layer a hard mask layer is deposited and patterned using photolithography, thereby defining and masking the area where the bipolar transistor will be formed and forming extrinsic base windows in the hard mask that expose a part of the base layer, which adjoins the area where the bipolar transistor will be formed and which extends over a part of the collector drift region and a part of the STI regions. Then trenches are formed by removing the exposed base layer and etching the then exposed part of the collector drift region until the sub-collector region is exposed at the bottom of the trenches. A first sidewall of the trenches adjoins the collector drift region of the bipolar transistor and a second sidewall of the trenches adjoins the STI region. Then a TEOS (Tetraethyl Orthosilicate) layer is formed on the first and second sidewall of the trench by deposition and etch-back of TEOS. Subsequently the trenches are filled with undoped polysilicon up to the level of the base by deposition, CMP and dry etching techniques. Then an extrinsic base contact is made by deposition, planarization and etch-back of p-type polysilicon, partly filling the extrinsic base windows and electrically contacting the undoped polysilicon in the trench and the base layer. After removal of the hard mask, an emitter region is formed on a part of the base layer that extends over the collector drift region using, amongst others, deposition and photolithography process steps.

SUMMARY OF THE INVENTION

It is an object of the invention to provide for an alternative and less complex method of manufacturing a bipolar transistor that employs the Resurf effect. The invention is defined by the independent claims. Advantageous embodiments are defined by the dependent claims.

The method of manufacturing the bipolar transistor according to the invention comprises the steps of:
providing on the semiconductor substrate a collector region of a first semiconductor material, which is of a first conductivity type and which adjoins an isolation region;
forming a first base layer of a second semiconductor material, which is of a second conductivity type opposite to the first conductivity type, on the collector region and on the isolation region;
forming a base window in the first base layer having a bottom surface, that exposes a top surface of the collector region and a portion of the isolation region, and having a sidewall that exposes a sidewall of the first base layer;
forming a trench, which adjoins the collector region and a remaining portion of the isolation region, by removing the portion of the isolation region that is exposed by the base window;
forming an isolation layer on the surface of the trench;
forming a second base layer of a third semiconductor material of the second conductivity type on the sidewall of the first base layer, on the isolation layer and on the top surface of the collector region, thereby forming a field plate in the trench and a base region extending over the collector region, wherein the first base layer has an electrical connection to the field plate and the base region; and
forming an emitter region of the first conductivity type on a top part of the base region in the base window.

In this way the Resurf bipolar transistor is formed with an alternative and less complex method, because the base region and the field plates are formed simultaneously in one process step.

In an embodiment of the method according to the invention, the step of forming the emitter region further comprises the steps of:
forming inside spacers on a part of the second base layer that extends over the sidewall of the base window exposing a part of the base region that extends over the collector region;
depositing and planarizing an emitter layer, which is of a fourth semiconductor material of the first conductivity type, thereby filling the remaining part of the base window with the emitter layer; and
diffusing dopant from the emitter layer thereby forming the emitter region.

This method applies one photolithography step less, because only the formation of the base window requires a photolithography step, and the patterning of the emitter region is done with deposition and planarization and hence does not require photolithography.

In an embodiment of the method according to the invention, a gate electrode for a CMOS device is formed by patterning the first base layer after the step of forming the emitter region. In this way a simple method is available for the combined fabrication of Resurf bipolar transistors and CMOS devices, because the same layer is used for the first base layer and the gate electrode.

BRIEF DESCRIPTION OF THE DRAWINGS

These and other aspects of the invention will be further elucidated and described with reference to the drawings, in which.

The Figures are not drawn to scale. In general, identical components are denoted by the same reference numerals in the Figures.

DETAILED DESCRIPTION OF EMBODIMENTS

Figure 1:
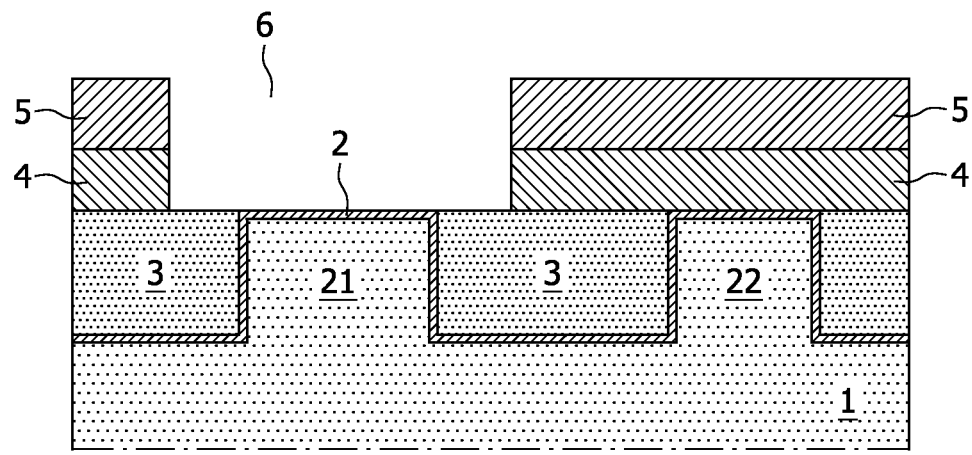
FIGS. 1 to 11 are diagrammatic cross-sectional views of an embodiment of a method of manufacturing a bipolar transistor according to the invention.

FIG. 1 shows a diagrammatic cross-sectional view in which on a semiconductor substrate 1, which comprises in this case n-type doped silicon, isolation regions 3, a collector region 21 and a collector contact region 22 are provided. The isolation regions 3 are fabricated, for example, with the shallow trench isolation (STI) technique and comprise, in this case, silicon dioxide. An etch stop layer 2, comprising, in this case, thermally grown silicon dioxide, is provided on the collector region 21. The collector region 21 and the collector contact region 22 both comprise, in this case, n-type doped silicon in which the collector contact region 22 has a higher doping level than the substrate 1 and the collector region 21, to provide for a reduced series resistance between the top surface of the collector contact region 22 and the substrate 1. Furthermore, a first base layer 4, in this case comprising p-type doped polysilicon, and a protection layer 5, in this case comprising silicon nitride, are provided on the isolation regions 3, collector region 21 and collector contact region 22. A base window 6 is provided, fabricated with standard photolithography and etching techniques, defining an opening in the protection layer 5 and the first base layer 4 and exposing a part of the etch stop layer 2, which part extends over the collector region 21, and parts of the isolation regions 3 that are adjacent to the collector region 21. Note that the base window 6 defines the area where the Resurf bipolar transistor will be manufactured. Further note that by forming the base window 6 such that the isolation regions 3 are not exposed by the base window 6, or, in another case, by omitting the isolation regions 3, a standard bipolar transistor will be formed that, consequently, does not exhibit the Resurf effect. Thus, this process enables the simultaneous formation of a Resurf and a standard bipolar transistor by an appropriate lay-out design of the base window 6 and/or the isolation regions 3.

Figure 2:
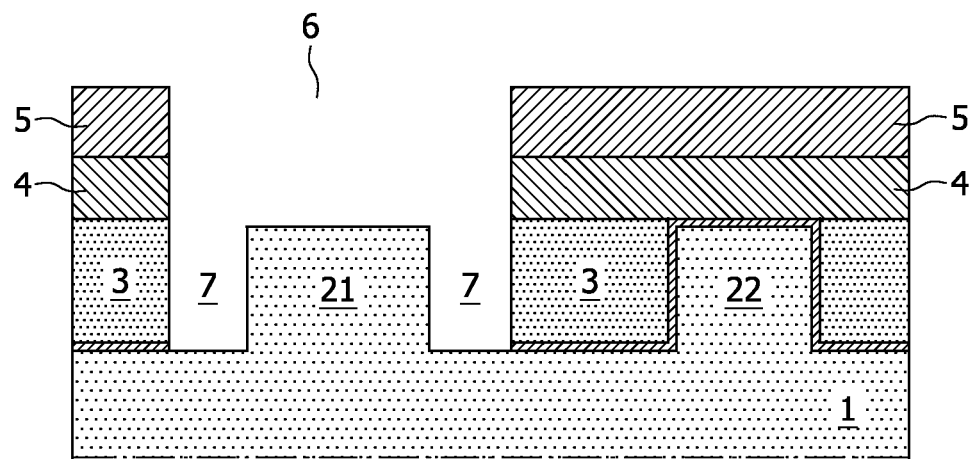

A dry etch is applied to remove etch stop layer 2 and parts of the isolation regions 3 that are exposed by the base window 6. Silicon dioxide is removed selectively with respect to the silicon of the collector region 21, with, for example, a selectivity of 40:1, in which case 400 nm of silicon dioxide etching from the isolation region 3 results in removing 10 nm of silicon from the collector region 21. In this way a trench 7 is formed, as is shown in FIG. 2, that, in this case, surrounds the collector region 21.

Figure 3:
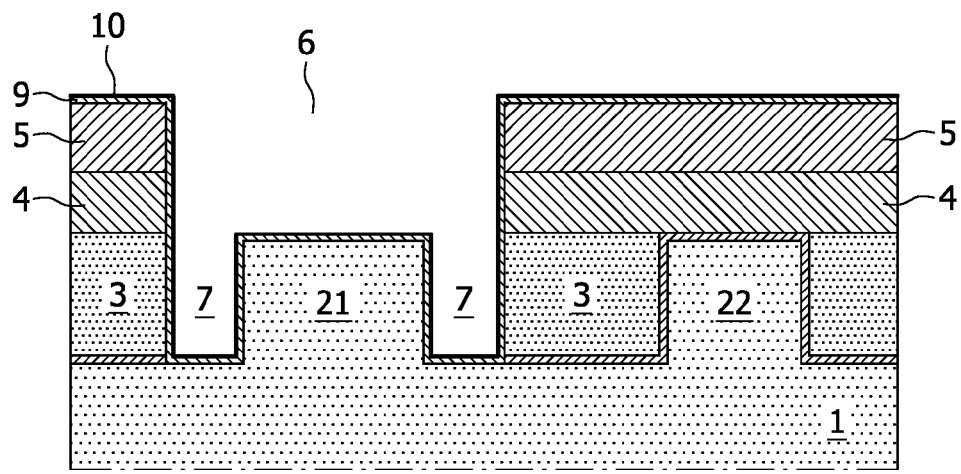

FIGS. 3-7 illustrate the formation of an isolation layer stack in the trench 7. A first dielectric layer 9 is deposited, e.g. made of silicon dioxide, and a second dielectric layer 10, e.g. made of silicon nitride thereby covering the collector region 21, the trench 7 and the exposed parts of the first base layer 4 and of the protection layer 5, as is shown in FIG. 3. Alternatively the first dielectric layer 9 is grown thermally and is consequently not present on the protection layer 5, which is e.g. made of silicon nitride, because the second dielectric layer 10, being of the same material as the protection layer 5, will then merge with the protection layer 5.

Figure 4:
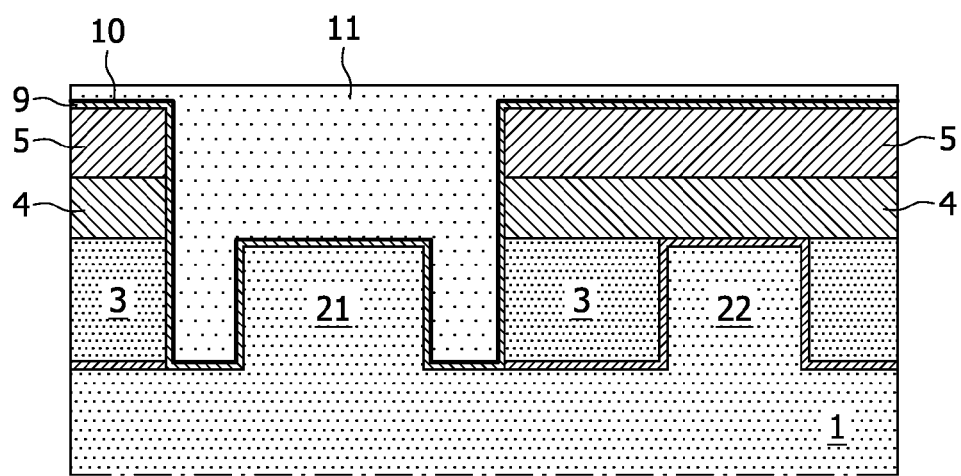

A third dielectric layer 11 is deposited thereby filling the trench 7 and the base window 6 and extending over the second dielectric layer 10. A CMP (Chemical Mechanical Planarization) step is applied to planarize the third dielectric layer 11, as is illustrated in FIG. 4. For example, a non-critical timed CMP step can be used that stops before the second dielectric layer 10 is exposed.

Figure 5:
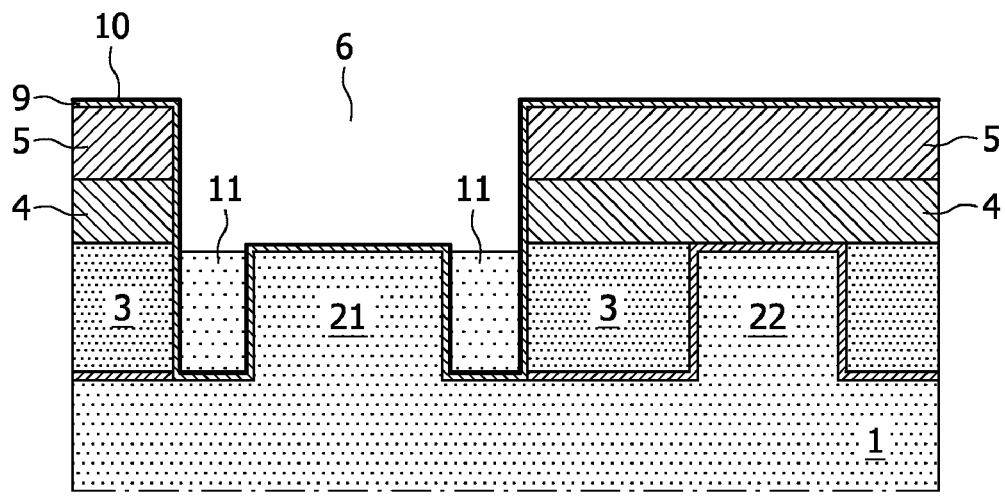

The third dielectric layer 11 is etched until a part of the second dielectric layer 10 is exposed that extends over the top surface of the collector region 21, e.g. using a wet silicon dioxide etch, as is shown in FIG. 5.

Figure 6:
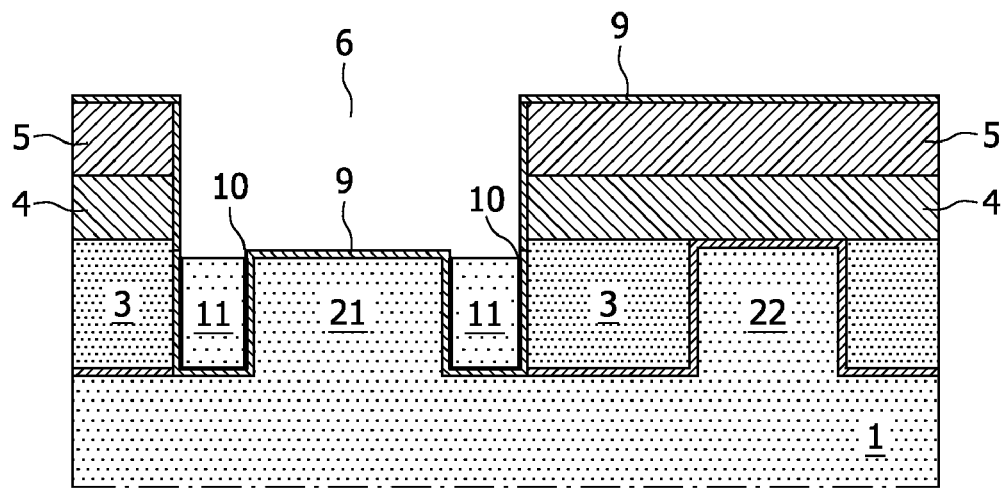

The exposed parts of the second dielectric layer 10 are removed, e.g. using a wet silicon nitride etch, thereby exposing a part of the first dielectric layer 9 that extends over the top surface of the collector region 21, and another part of the first dielectric layer 9 that extends over the first base layer 4 and over the protection layer 5, as is shown in FIG. 6.

Figure 7:
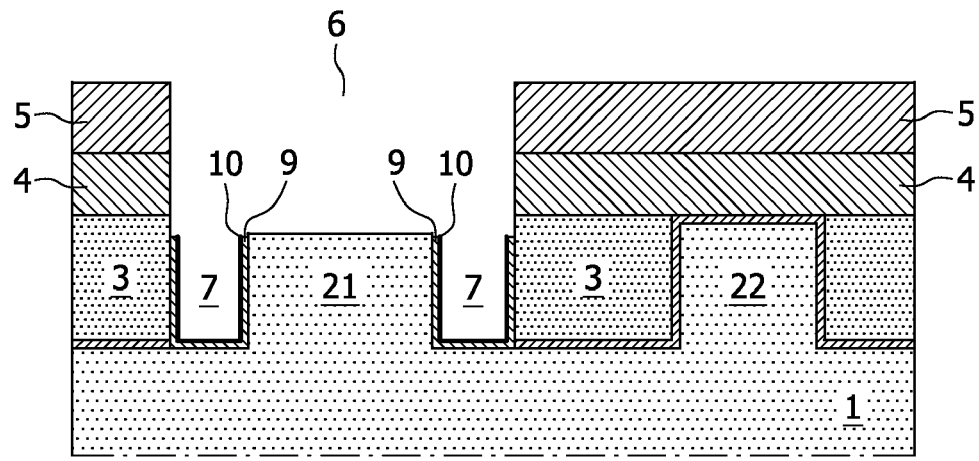

The third dielectric layer 11 and the exposed parts of the first dielectric layer 9 are removed completely, using e.g. a wet silicon dioxide etch, the result being that the sidewalls and bottom of the trench 7 are covered with the isolation layer stack comprising the first dielectric layer 9 and the second dielectric layer 10, as is illustrated in FIG. 7.

Figure 8:
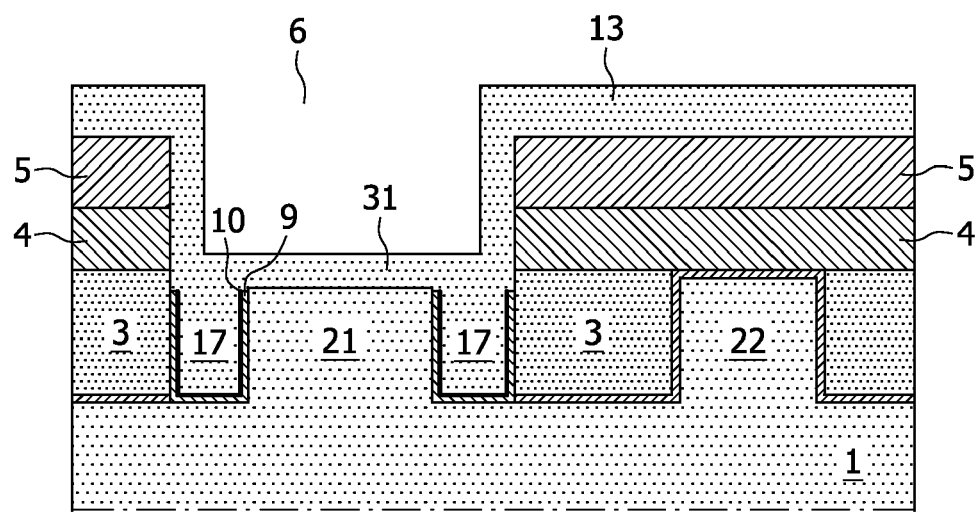

An epitaxial growth step is applied, forming a second base layer 13, as is shown in FIG. 8. The second base layer 13 extends over second dielectric layer 10 in the trench 7 thereby forming a field plate 17. Furthermore, the second base layer 13 also extends over the top surface of the collector region 21, where it forms a base region 31, and the second base layer 13 also extends over the sidewalls of the first base layer 4 and over the protection layer 5. The second base layer 13 for example comprises a stack of an undoped silicon layer, a SiGe:C layer and a p-type doped silicon layer, which comprise, for example, a 10 nm thick undoped silicon layer, a 25 nm to 35 nm thick SiGe:C layer comprising 20 at % Ge, 0.2 at % C including a 5 nm wide Boron spike dope with a concentration of $5 \cdot 10^{19}$ at/cm$^3$ 3 nm below the top surface, and a 50 nm to 100 nm thick p-type doped silicon layer. It is not required that the trench 7 is completely filled with the second base layer 13 as is suggested by FIGS. 8-11. As long as the result of the method is that the field plate 17 extends over the second dielectric layer 10 in the trench 7, the Resurf effect can be employed in the collector region 21. The field plate 17 reshapes the electric field distribution in the collector region 21 such that for the same collector-base breakdown voltage the doping concentration of the collector region 21 can effectively be increased resulting in a reduced collector resistance and hence an increased bipolar transistor speed. Note that the part of the second base layer 13 that extends over the top surface of the collector region 21 is mono-crystalline and that the remaining part of the second base layer 13 is poly-crystalline, because the second base layer 13 is grown epitaxially. Furthermore, note that the field plate 17 is electrically connected to the base region 31 and that the base region 31 is electrically connected to the first base layer 4.

Figure 9:
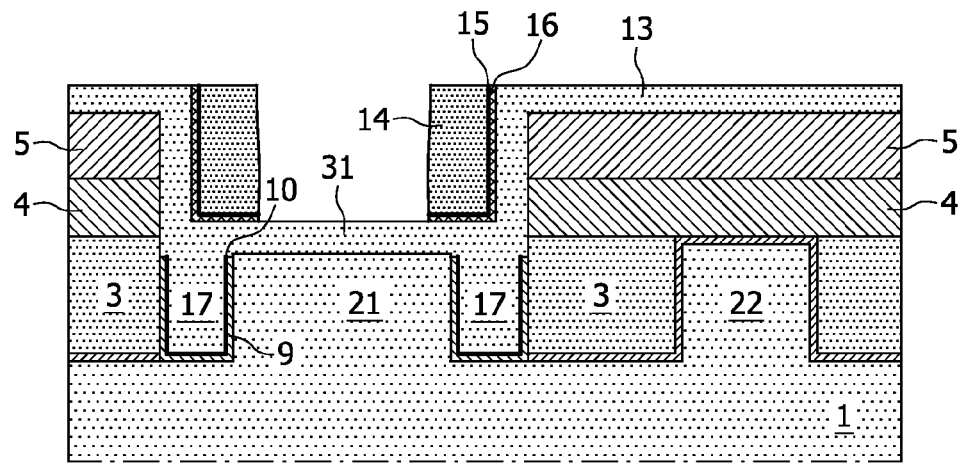

Inside spacers are made, e.g. by using standard spacer processing, comprising the deposition of a first TEOS spacer layer 16, a spacer nitride layer 15 and a second TEOS spacer layer 14 on the second base layer 13, for example with a thickness of, respectively, 10 nm, 25 nm and 200 nm. The second TEOS spacer layer 14 is densified, for example with a wet oxidation, and a TEOS spacer etch is applied removing a part of the second TEOS spacer layer 14 until a part of the spacer nitride layer 15 that extends over the base region 31 is exposed. The exposed part of the spacer nitride layer 15 is removed using a, for example, wet silicon nitride etch, thereby exposing a part of the first TEOS spacer layer 16 that extends over the base region 31. The exposed part of the first TEOS spacer layer 16 is removed with, for example, a wet silicon dioxide etch thereby exposing a part of the base region 31, as is illustrated in FIG. 9. Note that also the part of the second TEOS spacer layer 14, of the spacer nitride layer 15 and of the second TEOS spacer layer 16 that extend over the top surface of the second base layer 13 are removed.

Figure 10:
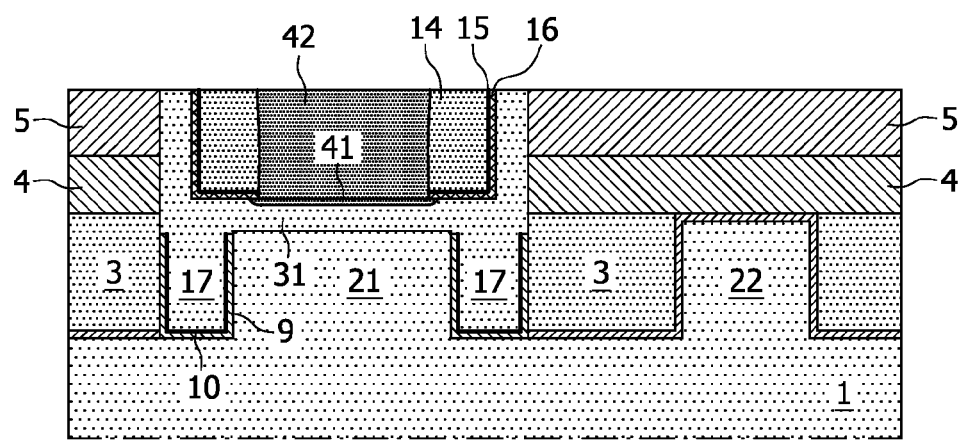
Figure 11:
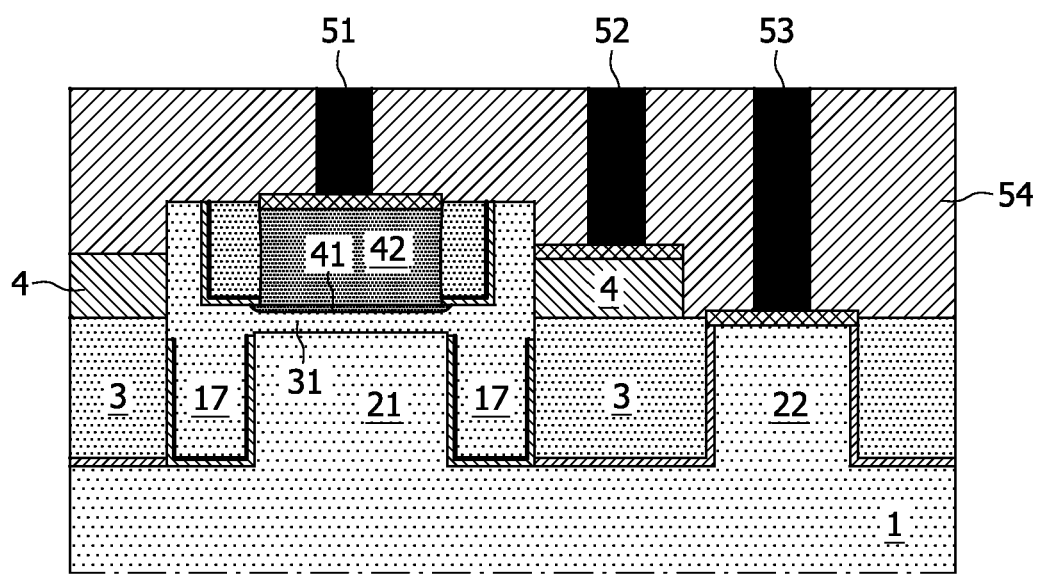

An emitter layer 42 is deposited, comprising, for example, n-type doped polysilicon having a thickness of 450 nm. As a result of a diffusion step, for example a Rapid Thermal Anneal (RTA) step, an emitter region 41 is formed in a region adjoining the top surface of the base region 31 by outdiffusion of n-type dopant out of the emitter layer 41 into the adjoining base region 31. A poly CMP step is applied to planarize and remove the emitter layer 42 until the protection layer 5 is exposed, as is illustrated in FIG. 10. The poly CMP step also removes the part of the second base layer 13 that extends over the top surface of the protection layer 5.

The exposed protection layer 5 is removed by applying, for example, a wet silicon nitride etch using, for example, $H_3PO_4$. Standard photolithography and etching steps are applied to pattern the first base layer 4. In the case that the method is part of a BiCMOS process, in which bipolar transistors and CMOS devices are manufactured in one process, this patterning step simultaneously patterns a gate electrode of the CMOS device. In that case the second base layer 13 is the same layer as is used for the gate electrode of the CMOS device, which comprises, for example, n-type doped polysilicon. Furthermore, CMOS implants can be used in the BiCMOS process to improve the performance of the bipolar transistor. The further processing of the bipolar transistor comprises, for example, the silicidation of the exposed silicon areas, e.g. a part of the collector contact region 22, a part of the second base layer 4 and a part of the emitter layer 42. Contacts of, for example, tungsten are formed providing electrical connections to the bipolar transistor, comprising a collector contact 53 on the collector contact region 22, a base contact 52 on the second base layer 4 and an emitter contact 51 on the emitter layer 42.

In summary, the invention provides for an alternative and less complex method of manufacturing a bipolar transistor comprising a field plate 17 in a trench 7 adjacent to a collector region 21, which field plate 17 employs a reduced surface field (Resurf) effect. The Resurf effect reshapes the electric field distribution in the collector region 21 such that for the same collector-base breakdown voltage the doping concentration of the collector region 21 can effectively be increased resulting in a reduced collector resistance and hence an increased bipolar transistor speed. The method comprises a step of forming a base window 6 in a first base layer 4 thereby exposing a top surface of the collector region 21 and a part of an isolation region 3. The trench 7 is formed by removing the exposed part of the isolation region 3, after which isolation layers 9 and 10 are formed on the surface of the trench 7. A second base layer 13 is formed on the isolation layer 10, thereby forming the field plate 17, on the top surface of the collector region 21, thereby forming a base region 31, and on a sidewall of the first base layer 4, thereby forming an electrical connection between the first base layer 4, the base region 31 and the field plate 17. An emitter region 41 is formed on a top part of the base region 31, thereby forming the Resurf bipolar transistor.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. A method of manufacturing a bipolar transistor on a semiconductor substrate, the method comprising:
    providing on the semiconductor substrate a collector region of a first semiconductor material, which is of a first conductivity type and which adjoins an isolation region;
    forming a first base layer of a second semiconductor material, which is of a second conductivity type opposite to the first conductivity type, on the collector region and on the isolation region;
    forming a base window in the first base layer having a bottom surface, that exposes a top surface of the collector region and a portion of the isolation region, and having a sidewall that exposes a sidewall of the first base layer;
    forming a trench, which adjoins the collector region and a remaining portion of the isolation region, by removing the portion of the isolation region that is exposed by the base window;
    forming an isolation layer on the surface of the trench;
    forming a second base layer of a third semiconductor material of the second conductivity type on the sidewall of the first base layer, on the isolation layer and on the top surface of the collector region, thereby forming a field plate in the trench and a base region extending over the collector region, wherein the first base layer has an electrical connection to the field plate and the base region; and
    forming an emitter region of the first conductivity type in a top part of the base region in the base window.

2. The method according to claim 1, wherein forming the emitter region further comprises:
    forming inside spacers on a part of the second base layer that extends over the sidewall of the base window exposing a part of the base region that extends over the collector region;
    depositing and planarizing an emitter layer, which is of a fourth semiconductor material of the first conductivity type, thereby filling the remaining part of the base window with the emitter layer; and
    diffusing dopant from the emitter layer thereby forming the emitter region.

3. The method according to claim 1, wherein after forming the emitter region, a gate electrode for a CMOS device is formed by patterning the first base layer.

4. The method according to claim 1, wherein a source and a drain region of a CMOS device are formed after the step of forming the emitter region.

5. The method according to claim 1, wherein forming the isolation layer on the surface of the trench comprises:
    depositing a first dielectric layer of a first isolation material on exposed surfaces of the first base layer, of the trench and of the collector region;

depositing a second dielectric layer of a second isolation material on the first dielectric layer;

filling the trench with a third dielectric layer of the first isolation material;

removing a part of the second dielectric layer that is extending over the top surface of the collector region; and removing the third dielectric layer and a part of the first dielectric layer that is extending over the top surface of the collector region.

6. The method according to claim 1, the method comprising:

at the step of providing the collector region, providing an etch stop layer on the collector region;

at the step of forming the first base layer, forming the first base layer on the etch stop layer;

at the step of forming the base window, exposing a part of the etch stop layer that is extending over the top surface of the collector region; and at the step of forming the trench, removing the etch stop layer.

7. The method according to claim 1, the method further comprising, at the step of providing the collector region, the step of providing a collector contact region, wherein the isolation region laterally separates the collector contact region and the collector region and wherein the collector contact region is electrically connected to the collector region via the substrate.

8. The method according to claim 1, wherein the first base layer comprises a stack of a polysilicon base layer and a dielectric protection layer.

9. The method according to claim 8, wherein the dielectric protection layer comprises silicon nitride.

10. The method according to claim 1, wherein forming the second base layer comprises an epitaxial growth of a first silicon layer, a SiGe:C layer and a second silicon layer.

* * * * *